US012313054B2

(12) United States Patent
Kawabata et al.

(10) Patent No.: US 12,313,054 B2
(45) Date of Patent: *May 27, 2025

(54) FLUID CONTROL DEVICE

(71) Applicant: Murata Manufacturing Co., Ltd., Kyoto (JP)

(72) Inventors: Yutoku Kawabata, Kyoto (JP); Nobuhira Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 25 days.

This patent is subject to a terminal disclaimer.

(21) Appl. No.: 18/327,196

(22) Filed: Jun. 1, 2023

(65) Prior Publication Data

US 2023/0313790 A1    Oct. 5, 2023

Related U.S. Application Data

(62) Division of application No. 17/026,631, filed on Sep. 21, 2020, now Pat. No. 11,698,067.

(30) Foreign Application Priority Data

Sep. 30, 2019    (JP) ................... 2019-179611

(51) Int. Cl.
*F04B 43/04*        (2006.01)
*F04B 45/04*        (2006.01)
(Continued)

(52) U.S. Cl.
CPC ............ *F04B 43/046* (2013.01); *F04B 45/04* (2013.01); *F04B 45/047* (2013.01);
(Continued)

(58) Field of Classification Search
CPC ...... F04B 43/043; F04B 43/046; F04B 45/04; F04B 45/047; F04B 2203/0404; F04B 2203/0406; H01L 41/0973; H10N 30/2047
See application file for complete search history.

(56) References Cited

U.S. PATENT DOCUMENTS

2013/0058818 A1    3/2013  Hirata et al.
2013/0266461 A1*  10/2013  Hirata ................. F04B 43/0054
                                                                417/413.2
(Continued)

FOREIGN PATENT DOCUMENTS

JP    2012-528981 A    11/2012
JP    2013-053611 A    3/2013
(Continued)

OTHER PUBLICATIONS

Notice of Reasons for Rejection in Japanese Patent Application No. 2019-179611 dated Mar. 1, 2022.

*Primary Examiner* — Dominick L Plakkoottam
*Assistant Examiner* — Charles W Nichols
(74) *Attorney, Agent, or Firm* — McDonald Hopkins LLC

(57) ABSTRACT

A first main plate has a first principal surface and a second principal surface. A second main plate has a third principal surface, a fourth principal surface, and an aperture. A piezoelectric element is provided on the first main plate and vibrates the first main plate. A first frame is disposed outside an outer peripheral end of the first main plate. First connecting portions connect the first main plate and the first frame to each other. Apertures are formed between the first connecting portions and connect a space adjacent to the first principal surface and a space adjacent to the second principal surface to each other. The second frame is disposed outside an outer peripheral end of the first frame. A second (Continued)

connecting portion connects the first frame and the second frame to each other.

5 Claims, 7 Drawing Sheets

(51) Int. Cl.
  *F04B 45/047* (2006.01)
  *H10N 30/20* (2023.01)
(52) U.S. Cl.
  CPC .............. *F04B 2203/0404* (2013.01); *F04B 2203/0406* (2013.01); *H10N 30/2047* (2023.02)

(56) References Cited

U.S. PATENT DOCUMENTS

| | | |
|---|---|---|
| 2016/0377073 A1 | 12/2016 | Tanaka et al. |
| 2017/0138357 A1 | 5/2017 | Kondo et al. |
| 2017/0218949 A1 | 8/2017 | Yokoi et al. |
| 2018/0066650 A1* | 3/2018 | Fujisaki .................. F04B 53/16 |

FOREIGN PATENT DOCUMENTS

| | | |
|---|---|---|
| JP | 5177331 B1 | 4/2013 |
| JP | 2019-039436 A | 3/2019 |
| WO | 2008/126377 A1 | 10/2008 |
| WO | 2010/139918 A1 | 12/2010 |

\* cited by examiner

FLUID CONTROL DEVICE

CROSS REFERENCE TO RELATED APPLICATION

This application is a division of U.S. patent application Ser. No. 17/026,631 filed on Sep. 21, 2020, which claims priority from Japanese Patent Application No. 2019-179611 filed on Sep. 30, 2019. The contents of these applications are incorporated herein by reference in their entireties.

BACKGROUND

The present disclosure relates to a fluid control device that utilizes pressure variation generated by vibration of a vibrating plate.

Various fluid control devices that transport fluid by using a piezoelectric material have been devised (see, for example, Japanese Patent No. 5177331 (hereinafter referred to as Patent Document 1)).

A pump device described in Patent Document 1 includes a housing having an inner space. The pump device further includes a vibrating plate, a piezoelectric element, and elastic support parts. The vibrating plate is disposed in the inner space, and the piezoelectric element is attached to the vibrating plate. The elastic support parts are connected to an outer peripheral portion of the vibrating plate and to an inner wall surface of the housing. According to this structure, the vibrating plate is held such that the vibrating plate can vibrate with respect to the housing.

The piezoelectric element is deformed due to driving vibration, and bending vibration of the vibrating plate is generated by the deformation of the piezoelectric element. The pressure in the inner space varies in response to the bending vibration, so that fluid is transported in one direction.

However, according to the pump device (fluid control device) of the related art described in Patent Document 1, part of the vibration of the vibrating plate may have adverse influence on the pressure distribution in a pump chamber (see FIG. 4B described below).

Therefore, it is difficult to improve the flow rate characteristics of the pump device according to the related art.

BRIEF SUMMARY

The present disclosure provides a fluid control device with improved flow rate characteristics.

According to embodiments of the present disclosure, a fluid control device includes a first main plate, a second main plate, a side wall member, a driving body, a first frame, first connecting portions, second apertures, a second frame, a pump chamber, and a second connecting portion. The first main plate has a first principal surface and a second principal surface. The second main plate has a third principal surface, a fourth principal surface, and a first aperture that connects a space adjacent to the third principal surface and a space adjacent to the fourth principal surface to each other. The second main plate is disposed such that the third principal surface faces the first principal surface. The side wall member is substantially annular and connected to an outer edge of the third principal surface of the second main plate. The driving body is provided on the first main plate and configured to vibrate the first main plate. The first frame is disposed outside an outer peripheral end of the first main plate. The first connecting portions connect the first main plate and the first frame to each other. Each of the second apertures is formed between adjacent ones of the first connecting portions and connects a space adjacent to the first principal surface and a space adjacent to the second principal surface to each other. The second frame is disposed outside an outer peripheral end of the first frame. The pump chamber is formed by connecting the second main plate and the second frame to each other with the side wall member. The pump chamber communicates with the first aperture and the second apertures. The second connecting portion connects the first frame and the second frame to each other.

According to the above-described structure, the outer end of the vibration of the first main plate is at the outer peripheral end of the first frame, and the second apertures are disposed inside the first frame. Accordingly, the vibration of the first main plate has a node at substantially the same position as the position of the second apertures. Thus, the shape of the vibration of the first main plate substantially coincides with the shape of the pressure distribution in the pump chamber between the first main plate and the second main plate. Therefore, adverse influence of the vibration on the pressure variation can be reduced.

According to the present disclosure, the flow rate characteristics can be improved.

Other features, elements, characteristics and advantages of the present disclosure will become more apparent from the following detailed description of embodiments of the present disclosure with reference to the attached drawings.

DETAILED DESCRIPTION

First Embodiment

Figure 1:
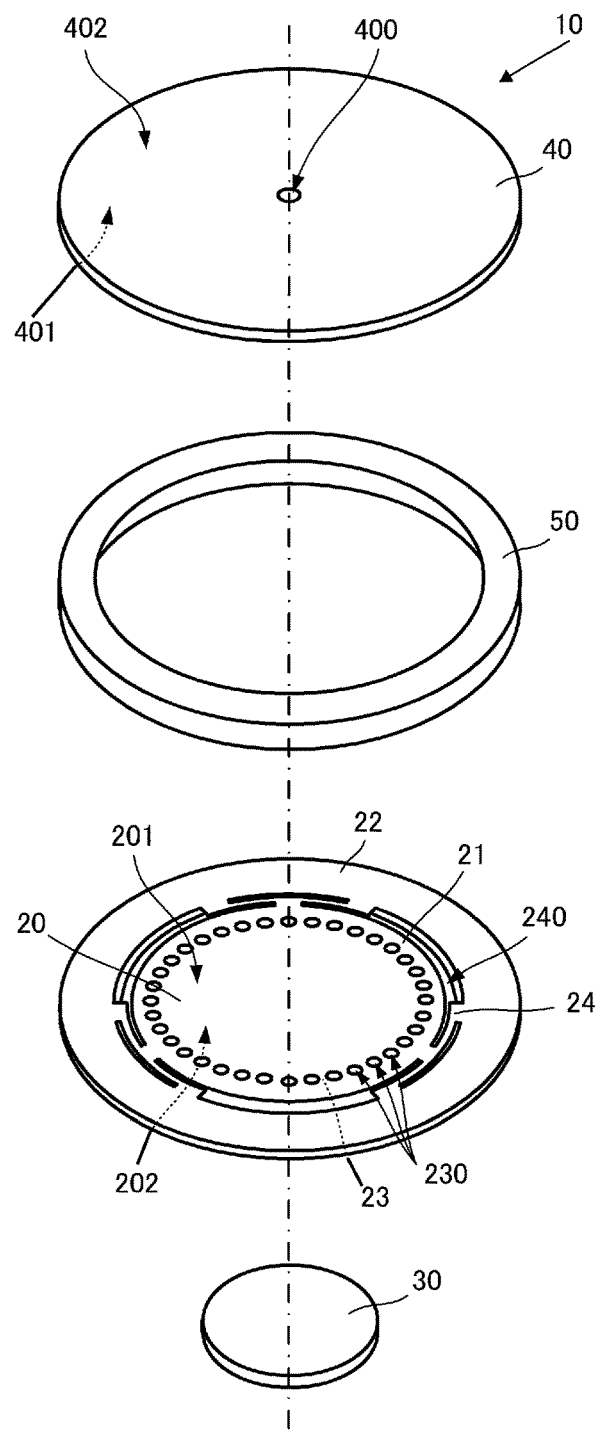
FIG. 1 is an exploded perspective view of a fluid control device according to a first embodiment.
Figure 2:
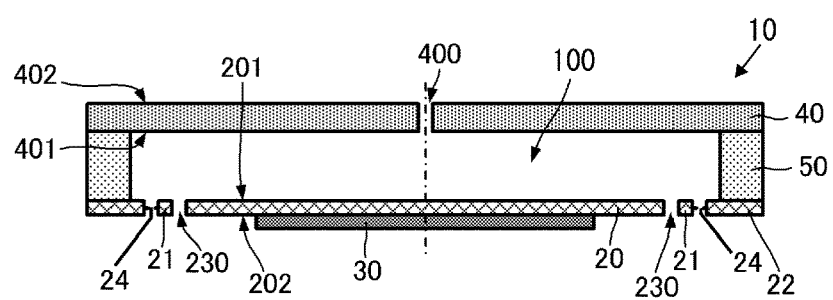
FIG. 2 is a sectional view illustrating the structure of the fluid control device according to the first embodiment.
Figure 3:
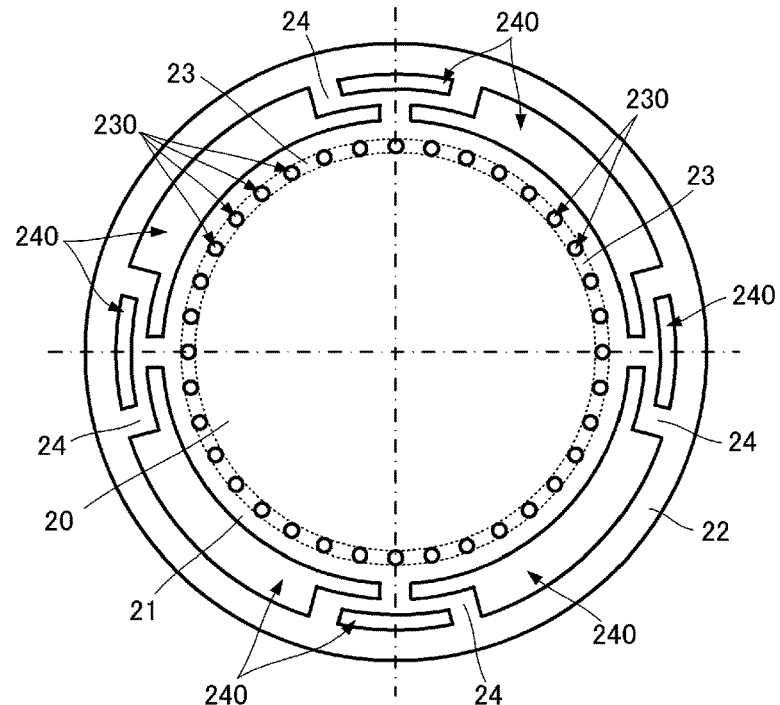
FIG. 3 is a plan view of a flat plate including a first main plate of the fluid control device according to the first embodiment.

A fluid control device according to a first embodiment of the present disclosure will now be described with reference to the drawings. FIG. 1 is an exploded perspective view of the fluid control device according to the first embodiment. FIG. 2 is a sectional view illustrating the structure of the fluid control device according to the first embodiment. FIG. 3 is a plan view of a flat plate including a first main plate of the fluid control device according to the first embodiment. In each of the figures illustrating embodiments described below, the shape of a part or the entirety of each component may be exaggerated to facilitate understanding. In addition, to improve the readability of the figures, reference signs for uniquely identifiable components may be omitted.

Structure of Fluid Control Device 10

As illustrated in FIGS. 1 and 2, a fluid control device 10 includes a first main plate 20, a first frame 21, a second frame 22, first connecting portions 23, second connecting portions 24, a piezoelectric element 30, a second main plate 40, and a side wall member 50. The piezoelectric element 30 corresponds to a "driving body" according to the present disclosure.

Figure 4A:
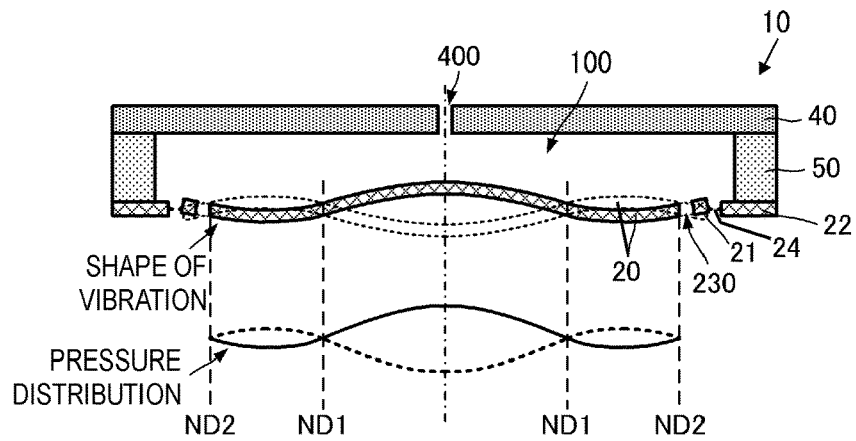
FIG. 4A illustrates the relationship between the pressure distribution and the shape of vibration of the fluid control device according to the first embodiment.

As illustrated in FIGS. 1 and 3, the first main plate 20 is a flat plate that is substantially circular in plan view when viewed in a direction perpendicular to a first principal surface 201 of the first main plate 20. The first main plate 20 has a substantially circular first principal surface 201 and a substantially circular second principal surface 202. The first principal surface 201 and the second principal surface 202 are opposite to each other. The first main plate 20 is made of, for example, a metal. There is no limitation regarding the first main plate 20 as long as bending vibration thereof can be generated by deformation of the piezoelectric element 30, which will be described below. Referring to FIG. 4A described below, the bending vibration is vibration in which the first principal surface 201 and the second principal surface 202 are deformed in substantially wavy shapes in side view of the first main plate 20.

The first frame 21, which is a flat plate, is substantially annular and has a substantially circular outer periphery in plan view. The first frame 21 is disposed outside the outer peripheral end of the first main plate 20.

The first connecting portions 23 are disposed between the first main plate 20 and the first frame 21. The first connecting portions 23 are arranged with gaps therebetween along a circle centered on the central point of the first main plate 20. The first connecting portions 23 are connected to the outer peripheral end of the first main plate 20 and the inner peripheral end of the first frame 21.

The second frame 22 is a flat plate that is substantially annular in plan view. The second frame 22 is disposed outside the outer peripheral end of the first frame 21.

The second connecting portions 24 are substantially beam shaped. The second connecting portions 24 are disposed between the first frame 21 and the second frame 22. The second connecting portions 24 are connected to the outer peripheral end of the first frame 21 and the inner peripheral end of the second frame 22. Plural second connecting portions 24 are provided. The second connecting portions 24 are arranged with gaps therebetween along the outer periphery of the first frame 21. The number of second connecting portions 24 may be any number of 3 or more, and the second connecting portions 24 may be arranged at equal intervals along the outer periphery. In the region between the first frame 21 and the second frame 22, spaces where the second connecting portions 24 are not provided serve as apertures 240.

The first connecting portions 23 have a plurality of apertures 230 therebetween. The apertures 230 correspond to "second apertures" according to the present disclosure. The apertures 230 connect a space adjacent to the first principal surface 201 and a space adjacent to the second principal surface 202 to each other between the first connecting portions 23. The apertures 230 are through holes that are substantially circular in plan view, that is, substantially cylindrical through holes. The apertures 230 are arranged along a circle at the outer periphery of the first main plate 20. Each of apertures 230 is formed between adjacent ones of the first connecting portions 23. The apertures 230 can be arranged at equal intervals.

The shape and number of the beams and the number of the apertures 230 in the above-described structure are appropriately set so that the modulus of elasticity of the second connecting portions 24 is lower than the modulus of elasticity of the first connecting portions 23. In other words, the beams of the second connecting portions 24 are easily deformed, and the first connecting portions 23 are not easily deformed.

According to the above-described structure, the first main plate 20, the first connecting portions 23, and the first frame 21 form a flat plate portion (vibrating portion), which is held by the second connecting portions 24 such that the flat plate portion (vibrating portion) can vibrate with respect to the second frame 22.

The first main plate 20, the first frame 21, the second frame 22, the first connecting portions 23, and the second connecting portions 24 may be formed integrally with each other. Conversely, it is optional that these elements be formed integrally with each other. The portion including the first main plate 20, the first frame 21, the second frame 22, the first connecting portions 23, and the second connecting portions 24 can be easily formed when these elements are formed integrally with each other.

The piezoelectric element 30 includes a substantially circular piezoelectric plate and driving electrodes. The driving electrodes are formed on both principal surfaces of the substantially circular piezoelectric plate.

The piezoelectric element 30 is disposed on the second principal surface 202 of the first main plate 20. The center of the piezoelectric element 30 substantially coincides with the center of the first main plate 20 in plan view. The piezoelectric element 30 is deformed when a driving signal is applied to the driving electrodes. As described above, this deformation causes vibration of the flat plate portion (vibrating portion) formed of the first main plate 20, the first connecting portions 23, and the first frame 21.

The second main plate 40 is a flat plate that is substantially circular in plan view. The material, thickness, etc., of the second main plate 40 can be such that bending vibration of the second main plate 40 hardly occurs. The outer shape of the second main plate 40 is large enough to cover the outer shape of the portion including the first main plate 20, the first frame 21, the second frame 22, the first connecting portions 23, and the second connecting portions 24. The second main plate 40 has a substantially circular third principal surface 401 and a substantially circular fourth principal surface 402. The third principal surface 401 and the fourth principal surface 402 are opposite to each other.

The second main plate 40 also has an aperture 400. The aperture 400 corresponds to a "first aperture" according to the present disclosure. The aperture 400 is a substantially cylindrical through hole that extends between the third principal surface 401 and the fourth principal surface 402 of the second main plate 40. The aperture 400 is positioned to overlap the center of the second main plate 40.

The second main plate 40 is disposed such that the principal surfaces of the second main plate 40 and the first main plate 20 are parallel to each other. In this state, the third principal surface 401 of the second main plate 40 and the first principal surface 201 of the first main plate 20 face each other. The center of the second main plate 40 in plan view substantially coincides with the center of the first main plate 20 in plan view.

The side wall member 50 is a substantially annular column. The substantially annular column of the side wall member 50 can be a circler ring-shape, oval ring-shape, elliptical ring-shape, square ring-shape, rectangular ring-shape polygonal ring-shape. The material, thickness, etc., of the side wall member 50 can be such that bending vibration of the side wall member 50 hardly occurs. The side wall member 50 may be formed either separately from or integrally with the second frame 22 or the second main plate 40.

The side wall member 50 is disposed between the second frame 22 and the second main plate 40. One end of the side wall member 50 in the height direction is connected to a surface of the second frame 22 adjacent to the first principal surface 201. The other end of the side wall member 50 in the height direction is connected to the third principal surface 401 of the second main plate 40.

According to the above-described structure, the fluid control device 10 has a space surrounded by the second main plate 40, the side wall member 50, and the flat plate formed of the first main plate 20, the first frame 21, the second frame 22, the first connecting portions 23, and the second connecting portions 24. This space serves as a pump chamber 100 of the fluid control device 10. The pump chamber 100 communicates with the first aperture 400 and the second apertures 230. In other words, the pump chamber 100 communicates with a space outside the fluid control device 10 through the first aperture 400 and the second apertures 230. Although the pump chamber 100 also communicates with the outside space through the apertures 240, it is not necessary that the pump chamber 100 communicate with the outside space through the apertures 240.

Figure 4B:
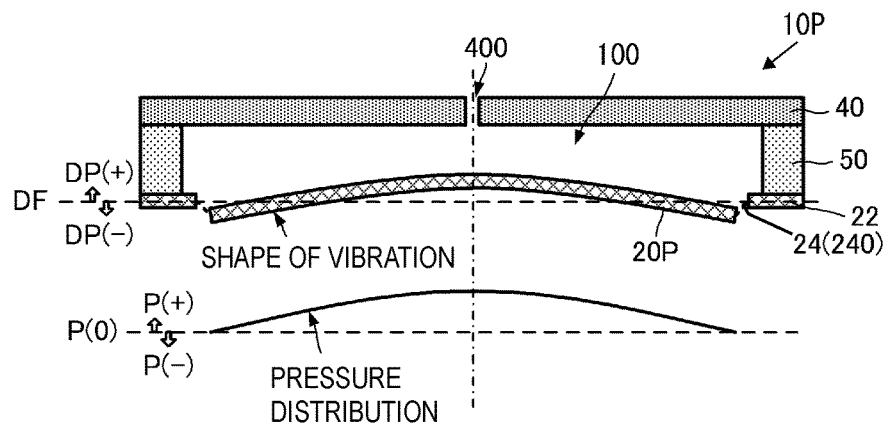
FIG. 4B illustrates the relationship between the pressure distribution and the shape of vibration of a fluid control device according to the related art.

The fluid control device 10 having the above-described structure transports fluid based on the principle described below. FIG. 4A illustrates the relationship between the pressure distribution and the shape of vibration of the fluid control device according to the first embodiment. FIG. 4B illustrates the relationship between the pressure distribution and the shape of vibration of a fluid control device according to the related art. Although FIG. 4B shows first-order vibration to facilitate description, a similar phenomenon occurs in response to second or higher order vibration.

When a driving signal (driving voltage) of a predetermined frequency is applied to the piezoelectric element 30 of the fluid control device 10 according to the present embodiment, the piezoelectric element 30 is deformed at a predetermined frequency, as illustrated in FIG. 4A. Thus, as illustrated in FIG. 4A, the flat plate portion formed of the first main plate 20, the first connecting portions 23, and the first frame 21 (this portion is referred to as a vibrating portion in the following description) resonates. FIG. 4A illustrates second-order resonant vibration.

As illustrated in FIG. 4A, this vibration generates a pressure distribution having a node at the position of the apertures 230 (position of the first connecting portions 23) in the pump chamber 100. Owing to the pressure distribution, for example, the fluid control device 10 allows fluid to flow into the pump chamber 100 through the apertures 230, transports the fluid through the pump chamber 100, and discharges the fluid out of the pump chamber 100 through the aperture 400.

The fluid control device 10 is structured such that the center of the vibrating portion serves as an antinode of the vibration and that two vibration nodes ND1 and ND2 are arranged in a direction toward the outer periphery of the vibrating portion. The outer peripheral end of the vibrating portion is held by the second connecting portions 24 such that the outer peripheral end can vibrate, and therefore serves as a free end. Accordingly, as illustrated in FIG. 4A, the node ND2 adjacent to the outer periphery of the vibrating portion can be positioned around the first connecting portions 23, that is, around the apertures 230.

As described above, the pressure variation in the pump chamber 100 has a node at the position of the apertures 230 (position of the first connecting portions 23), and nodes in the pump chamber 100 including the above-mentioned node are determined by the order of the vibration. Accordingly, as illustrated in FIG. 4A, the pressure distribution includes an antinode of the pressure variation at a position that overlaps the center of the vibrating portion and two nodes of the pressure variation, similarly to the vibration of the vibrating portion.

The fluid control device 10 is structured such that the apertures 230 communicate with the outside of the fluid control device 10. Therefore, the position of the node of the pressure variation adjacent to the outer periphery substantially coincides with the position of the apertures 230.

Accordingly, as illustrated in FIG. 4A, the shape of the vibration and the shape of the pressure distribution are substantially the same. Namely, in a region closer to the center of the first main plate 20 than the apertures 230 are (than the node ND2 is), the shape of the vibration (displacement of the vibrating portion) and the displacement of the pressure distribution are in the same direction.

Therefore, according to the fluid control device 10, adverse influence of the vibration on the pressure distribution can be reduced. As a result, the fluid control device 10 has good flow rate characteristics.

As illustrated in FIG. 4B, a fluid control device 10P according to the related art has no apertures 230 and no first connecting portions 23, and a first main plate 20P is supported by second connecting portions 24 such that the first main plate 20P can vibrate with respect to a second frame 22. In this case, the vibration has no node at the outer peripheral end of the first main plate 20P, that is, at the position where the second connecting portions 24 are connected and where apertures 240 are formed. For example, at the time illustrated in FIG. 4B, the vibration of the first main plate 20P is such that displacement of a central portion with respect to a reference position DF, at which the first main plate 20P is at in a non-vibrated state, is a displacement DP(+) toward a pump chamber 100, and such that displacement of a portion near the apertures 240 with respect to the reference position DF is a displacement DP(−) in a direction away from the pump chamber 100.

The fluid control device 10P according to the related art is structured such that the pump chamber 100 communicates with the outside of the first main plate 20P through the apertures 240. Therefore, the pressure is P(0)=0 at the position of the apertures 240. At the time illustrated in FIG. 4B, the pressure in a region inside the apertures 240 is a positive pressure P(+). In other words, there is no region where the pressure is a negative pressure P(−).

Thus, according to the fluid control device 10P of the related art, in a region near the apertures 240, the pressure is a positive pressure P(+) but the displacement of the first main plate 20P is in the direction away from the pump chamber 100. Therefore, according to the fluid control device 10P of the related art, the shape of the vibration has adverse influence on the pressure distribution in the region near the apertures 240. As a result, the fluid control device 10P according to the related art does not have good flow rate characteristics.

According to the fluid control device 10 of the present disclosure, the shape of the vibration does not have adverse influence on the pressure distribution at any position. Therefore, good flow rate characteristics can be achieved.

In addition, according to the above-described structure, the first main plate 20 is a substantially circular plate. Therefore, the fluid control device 10 has low vibration energy loss.

In addition, according to the above-described structure, the apertures 230 are arranged along the entire circumference of the first main plate 20. Accordingly, the vibration energy is evenly distributed in all directions, and the flow rate characteristics of the fluid control device 10 can be improved.

Second Embodiment

Figure 5:
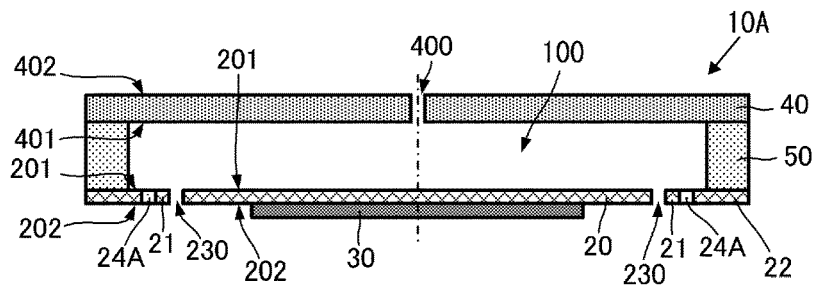
FIG. 5 is a sectional view illustrating the structure of a fluid control device according to a second embodiment.

A fluid control device according to a second embodiment of the present disclosure will now be described with reference to the drawings. FIG. 5 is a sectional view illustrating the structure of the fluid control device according to the second embodiment.

As illustrated in FIG. 5, a fluid control device 10A according to the second embodiment differs from the fluid control device 10 according to the first embodiment in that a second connecting portion 24A is provided in place of the second connecting portions 24. Other structures of the fluid control device 10A are similar to those of the fluid control device 10, and description of similar features will be omitted.

The second connecting portion 24A is formed separately from the first frame 21 and the second frame 22. The second connecting portion 24A is a substantially annular elastic body. The material of the second connecting portion 24A is, for example, silicone rubber. The second connecting portion 24A may have any shape and be made of any material as long as the modulus of elasticity of the second connecting portion 24A is less than the modulus of elasticity of the first connecting portions 23. The second connecting portion 24A is joined to the first frame 21 and the second frame 22.

Similar to the fluid control device 10, the fluid control device 10A having the above-described structure also has good flow rate characteristics. The second connecting portion 24A of the above-described structure may have no apertures. When the second connecting portion 24A has no apertures, the pump chamber 100 can be appropriately sealed.

Third Embodiment

Figure 6A:
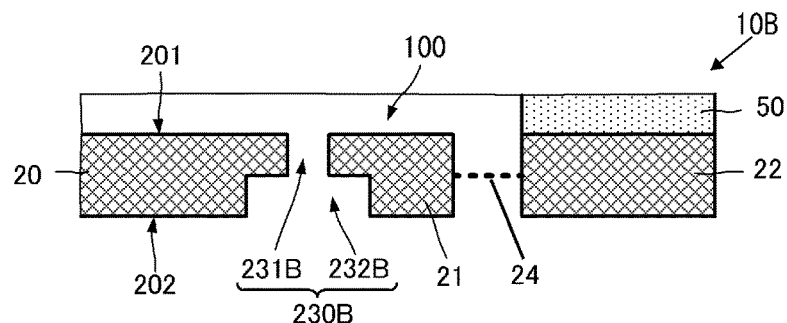
FIGS. 6A and 6B are enlarged sectional views illustrating the shapes of apertures in fluid control devices according to a third embodiment.
Figure 6B:
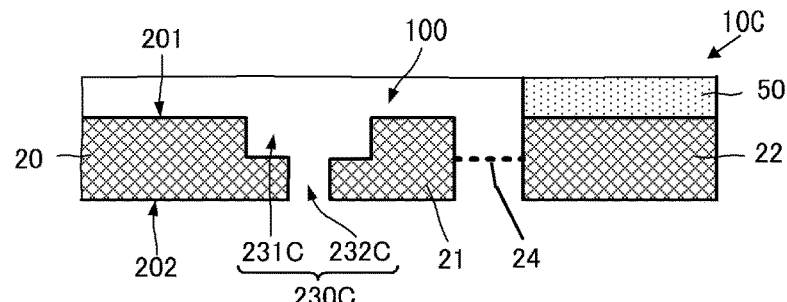

Fluid control devices according to a third embodiment of the present disclosure will now be described with reference to the drawings. FIGS. 6A and 6B are enlarged sectional views illustrating the shapes of apertures in the fluid control devices according to the third embodiment.

As illustrated in FIGS. 6A and 6B, fluid control devices 10B and 10C according to the third embodiment differ from the fluid control device 10 according to the first embodiment in the shapes of apertures 230B and 230C, respectively. Other structures of the fluid control devices 10B and 10C are similar to those of the fluid control device 10, and description of similar features will be omitted.

As illustrated in FIGS. 6A and 6B, each aperture 230B in the fluid control device 10B and each aperture 230C in the fluid control device 10C are shaped such that the opening area thereof in the first principal surface 201 and the opening area thereof in the second principal surface 202 differ from each other.

More specifically, as illustrated in FIG. 6A, the fluid control device 10B has the aperture 230B. The aperture 230B includes a first portion 231B and a second portion 232B. The first portion 231B opens in the first principal surface 201, and the second portion 232B opens in the second principal surface 202. The first portion 231B and the second portion 232B communicate with each other. The opening area of the second portion 232B is greater than the opening area of the first portion 231B. Accordingly, the opening area of the second portion 232B can be made greater than the opening area of each aperture 230 in the fluid control device 10. Therefore, according to the fluid control device 10B, not only can the above-described effects be obtained, but also the flow passage resistance of the aperture 230B can be reduced.

As illustrated in FIG. 6B, the fluid control device 10C has the aperture 230C. The aperture 230C includes a first portion 231C and a second portion 232C. The first portion 231C opens in the first principal surface 201, and the second portion 232C opens in the second principal surface 202. The first portion 231C and the second portion 232C communicate with each other. The opening area of the first portion 231C is greater than the opening area of the second portion 232C. Accordingly, for example, the opening area of the first portion 231C can be made greater than the opening area of each aperture 230 in the fluid control device 10. Therefore, according to the fluid control device 10C, not only can the above-described effects be obtained, but also the flow passage resistance of the aperture 230C can be reduced.

According to the above-described structure, the flow rate characteristics of the fluid control devices 10B and 10C can be further improved.

Fourth Embodiment

Figure 7A:
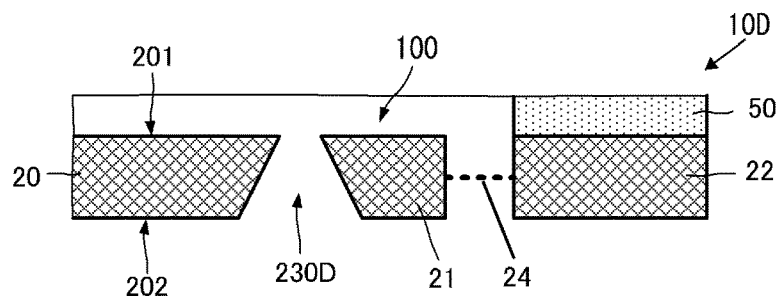
FIGS. 7A and 7B are enlarged sectional views illustrating the shapes of apertures in fluid control devices according to a fourth embodiment.
Figure 7B:
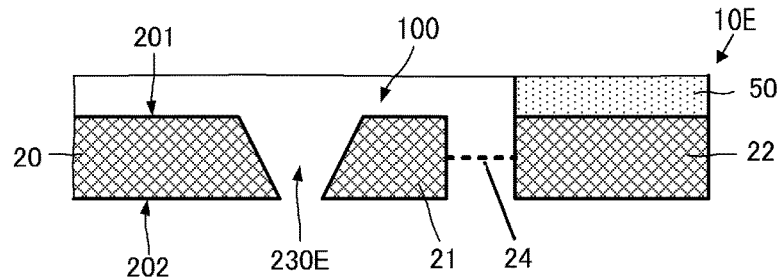

Fluid control devices according to a fourth embodiment of the present disclosure will now be described with reference to the drawings. FIGS. 7A and 7B are enlarged sectional views illustrating the shapes of apertures in the fluid control devices according to the fourth embodiment.

As illustrated in FIGS. 7A and 7B, fluid control devices 10D and 10E according to the fourth embodiment differ from the fluid control device 10 according to the first embodiment in the shapes of apertures 230D and 230E, respectively. Other structures of the fluid control devices 10D and 10E are similar to those of the fluid control device 10, and description of similar features will be omitted.

As illustrated in FIGS. 7A and 7B, each aperture 230D in the fluid control device 10D and each aperture 230E in the fluid control device 10E are shaped such that the opening area thereof in the first principal surface 201 and the opening area thereof in the second principal surface 202 differ from each other.

More specifically, as illustrated in FIG. 7A, each aperture 230D of the fluid control device 10D has a substantially tapered shape in side view, and the opening area thereof in the second principal surface 202 is greater than the opening area thereof in the first principal surface 201. Accordingly, the opening area in the second principal surface 202 can be made greater than the opening area of each aperture 230 in the fluid control device 10. Therefore, according to the fluid control device 10D, not only can the above-described effects be obtained, but also the flow passage resistance of the aperture 230D can be reduced.

As illustrated in FIG. 7B, each aperture 230E of the fluid control device 10E has a substantially tapered shape in side view, and the opening area thereof in the first principal surface 201 is greater than the opening area thereof in the second principal surface 202. Accordingly, the opening area in the first principal surface 201 can be made greater than the opening area of each aperture 230 in the fluid control device 10. Therefore, according to the fluid control device 10E, not only can the above-described effects be obtained, but also the flow passage resistance of the aperture 230E can be reduced.

According to the above-described structure, the flow rate characteristics of the fluid control devices 10D and 10E can be further improved.

Fifth Embodiment

Figure 8:
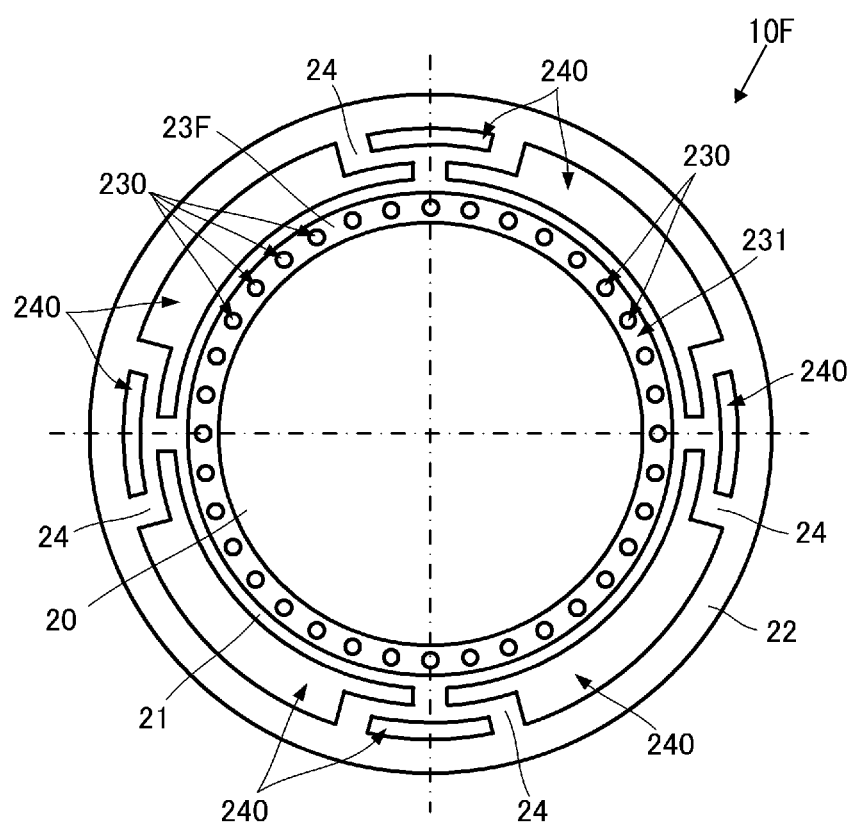
FIG. 8 is a plan view of a flat plate including a first main plate of a fluid control device according to a fifth embodiment.

A fluid control device according to a fifth embodiment of the present disclosure will now be described with reference to the drawings. FIG. 8 is a plan view of a flat plate including a first main plate of the fluid control device according to the fifth embodiment.

As illustrated in FIG. 8, a fluid control device 10F according to the fifth embodiment differs from the fluid control device 10 according to the first embodiment in the shape of first connecting portions 23F. The shapes of other portions of the fluid control device 10F are similar to those of the fluid control device 10, and description of similar features will be omitted.

The fluid control device 10F is structured such that the thickness of the first connecting portions 23F is less than the thickness of the first main plate 20 and the thickness of the first frame 21. In other words, the first connecting portions 23F form a substantially annular recess that is recessed from the first main plate 20 and the first frame 21.

Also in the above-described structure, the flow passage resistance of the apertures 230 in the fluid control device 10F can be reduced. Therefore, the flow rate characteristics of the fluid control device 10F can be improved.

Sixth Embodiment

Figure 9:
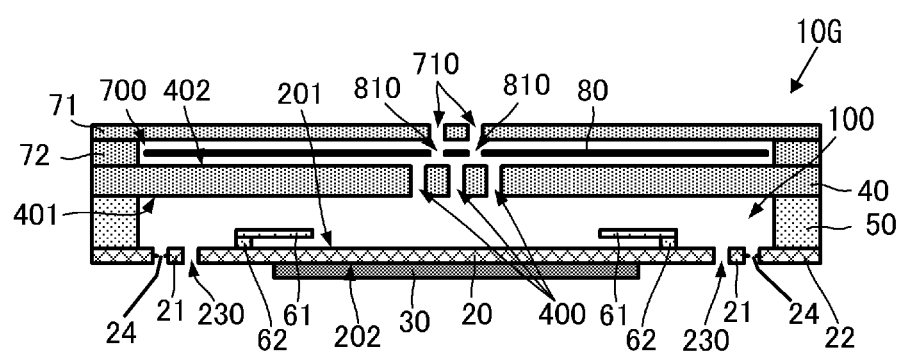
FIG. 9 is a sectional view illustrating the structure of a fluid control device according to a sixth embodiment.
Figure 10:
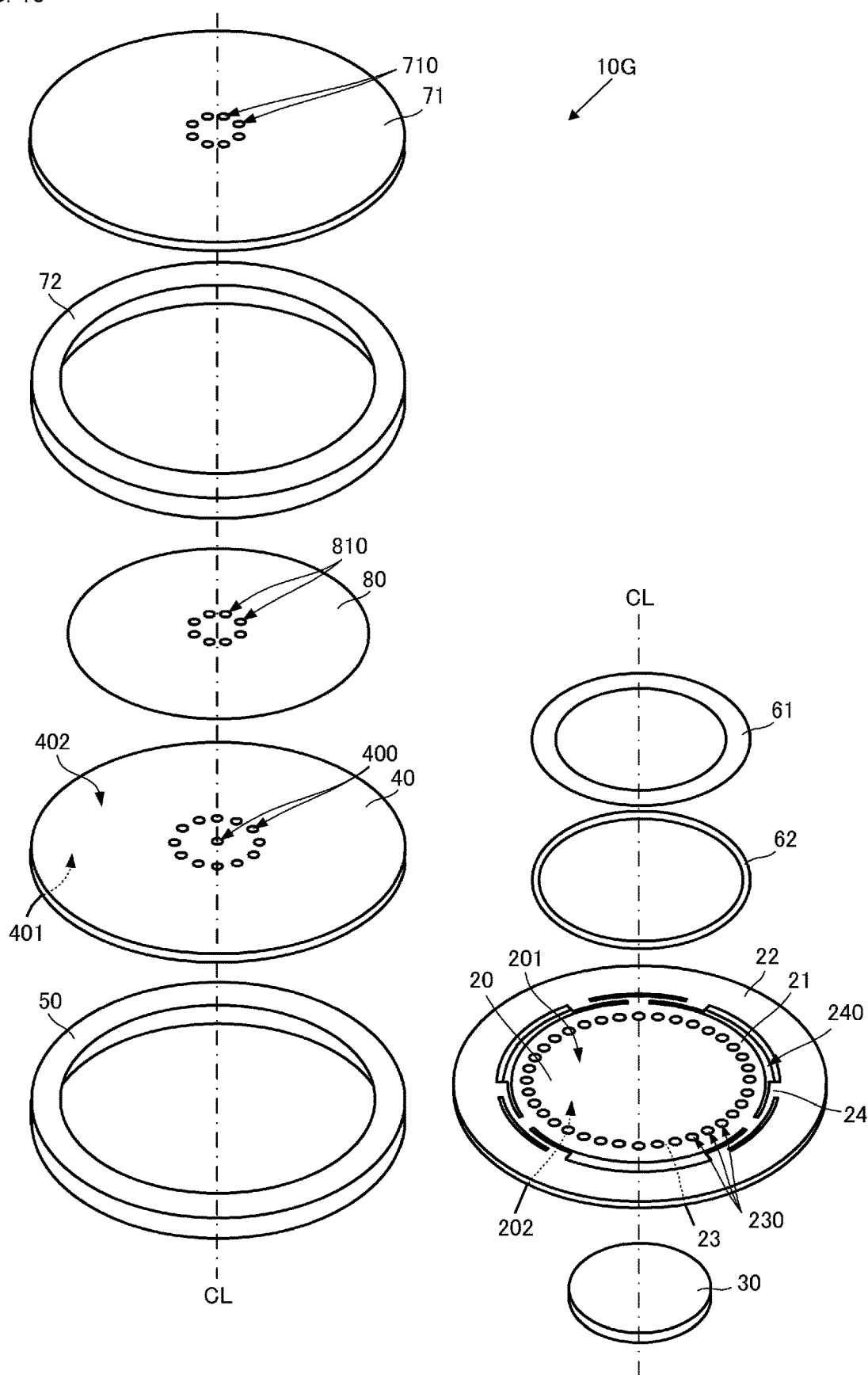
FIG. 10 is an exploded perspective view illustrating the structure of the fluid control device according to the sixth embodiment.

A fluid control device according to a sixth embodiment of the present disclosure will now be described with reference to the drawings. FIG. 9 is a sectional view illustrating the structure of the fluid control device according to the sixth embodiment.

As illustrated in FIG. 9, a fluid control device 10G according to the sixth embodiment differs from the fluid control device 10 according to the first embodiment in that a plurality of valve bodies are provided. Other structures of the fluid control device 10G are similar to those of the fluid control device 10, and description of similar features will be omitted.

The fluid control device 10G additionally includes a film 61, a fixing member 62, a third main plate 71, an outer peripheral support member 72, and a flat membrane 80.

The film 61 is substantially annular. The film 61 is made of a flexible material, and is bent when an external force is applied thereto. The fixing member 62 is a substantially annular adhesive member. The film 61 is fixed to the first principal surface 201 of the first main plate 20 by the fixing member 62. More specifically, when fluid is introduced through the apertures 230 and discharged through apertures 400, as illustrated in FIG. 9, the fixing member 62 fixes an outer peripheral portion of the film 61 and does not fix an inner peripheral portion of the film 61. When fluid is introduced through the apertures 400 and discharged through the apertures 230, the fixing member 62 fixes the inner peripheral portion of the film 61 and does not fix the outer peripheral portion of the film 61. According to this structure, the state of communication between the apertures 230 and the apertures 400 is set to either a communicated state or a non-communicated state depending on the direction in which the fluid flows into the pump chamber 100. Thus, a "first valve body" according to the present disclosure is realized.

The third main plate 71 is disposed adjacent to the fourth principal surface 402 of the second main plate 40 with a gap provided between the third main plate 71 and the second main plate 40. The third main plate 71 faces the second main plate 40. The outer peripheral support member 72 is substantially annular and is connected to the second main plate 40 and the third main plate 71. Thus, a space 700 surrounded by the second main plate 40, the third main plate 71, and the outer peripheral support member 72 is provided. The third main plate 71 has apertures 710. The apertures 710 are holes that extend through the third main plate 71 in the thickness direction. The apertures 710 are arranged so as not to overlap the apertures 400.

The flat membrane 80 is shaped such that the flat membrane 80 can be disposed in the space 700. The thickness of the flat membrane 80 is less than the height of the space 700. The flat membrane 80 has apertures 810. The apertures 810 are arranged to overlap the apertures 710. According to this structure, the state of communication between the pump chamber 100 and the outside of the fluid control device 10G is set to either a communicated state or a non-communicated state depending on the direction in which the fluid flows through the apertures 400. Thus, a "second valve body" according to the present disclosure is realized.

Similar to the fluid control device 10, the fluid control device 10G having the above-described structure also has good flow rate characteristics. In addition, the fluid control device 10G also has a high rectifying effect.

Although the first valve body and the second valve body may both be provided, only one of the first valve body and the second valve body may instead be provided.

Seventh Embodiment

Figure 11:
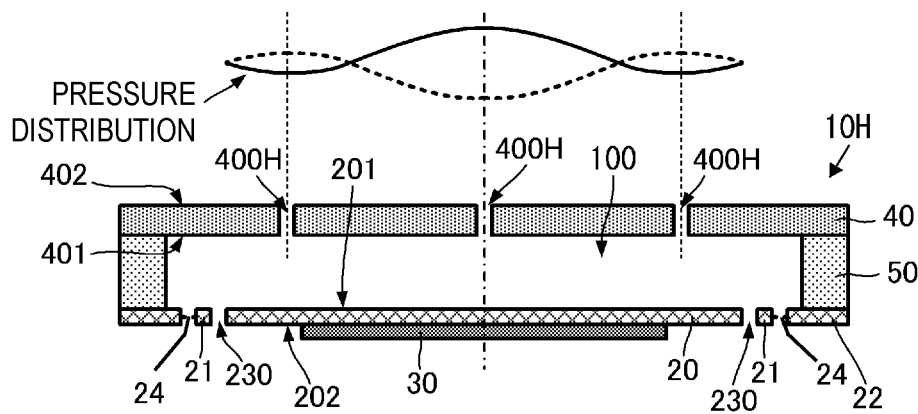
FIG. 11 is a sectional view illustrating the structure of a fluid control device according to a seventh embodiment.

A fluid control device according to a seventh embodiment of the present disclosure will now be described with reference to the drawings. FIG. 11 is a sectional view illustrating the structure of the fluid control device according to the seventh embodiment.

As illustrated in FIG. 11, a fluid control device 10H according to the seventh embodiment differs from the fluid control device 10 according to the first embodiment in that a plurality of apertures 400H are provided. Other structures of the fluid control device 10H are similar to those of the fluid control device 10, and description of similar features will be omitted.

The fluid control device 10H includes the plurality of apertures 400H. The apertures 400H are disposed at the center of the second main plate 40 and on a circle centered on the center of the second main plate 40 and having a predetermined radius. As illustrated in FIG. 11, the apertures 400H can be arranged at positions overlapping the antinodes of the pressure distribution, in other words, the antinodes of vibration.

Similar to the fluid control device 10, the fluid control device 10H having the above-described structure also has good flow rate characteristics. In addition, according to the fluid control device 10H, the flow rate can be increased.

Eighth Embodiment

Figure 12:
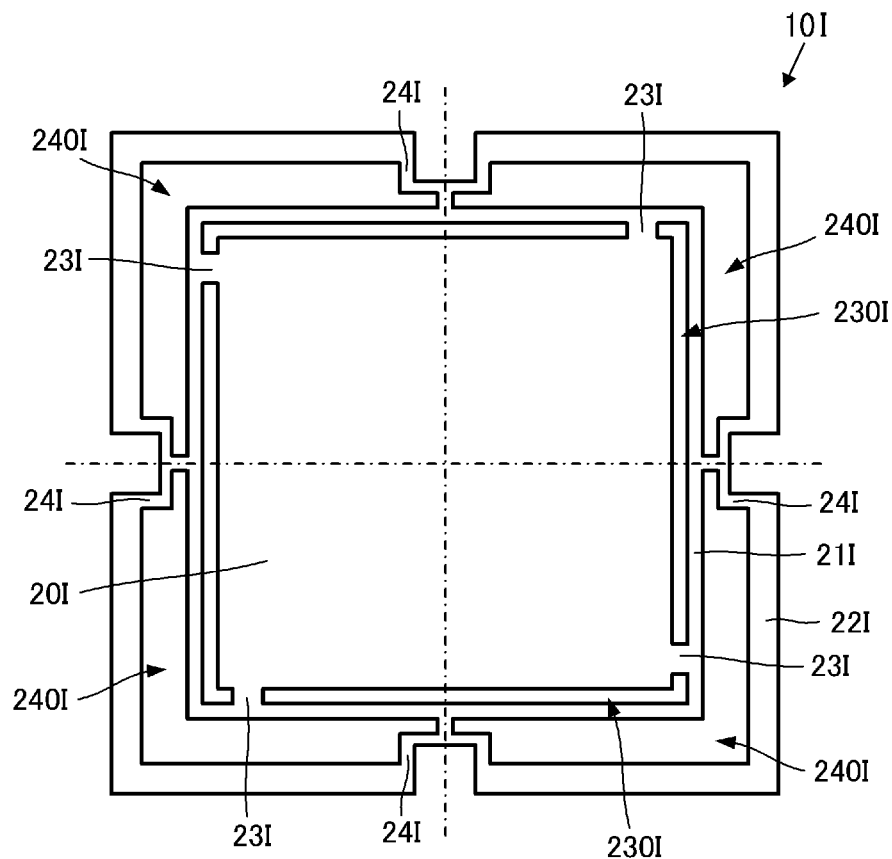
FIG. 12 is a plan view of a flat plate including a first main plate of a fluid control device according to an eighth embodiment.

A fluid control device according to an eighth embodiment of the present disclosure will now be described with reference to the drawings. FIG. 12 is a plan view of a flat plate including a first main plate of the fluid control device according to the eighth embodiment.

As illustrated in FIG. 12, the shape of a fluid control device 10I according to the eighth embodiment in plan view differs from that of the fluid control device 10 according to the first embodiment. Other structures of the fluid control device 10I are similar to those of the fluid control device 10, and description of similar features will be omitted.

The fluid control device 10I includes a first main plate 201 having a substantially square shape in plan view. A first frame 211 and a second frame 221 are substantially rectangular ring-shaped in plan view.

First connecting portions 231 are connected to sides of the first main plate 201 and sides of the first frame 211. Second connecting portions 241 are connected to sides of the first frame 211 and sides of the second frame 221.

Similar to the fluid control device 10, the fluid control device 10I having the above-described structure also has good flow rate characteristics. The first main plate 201, the first frame 211, and the second frame 221 may instead have a substantially polygonal shape other than a substantially square (rectangular) shape, a substantially elliptical shape, or a substantially oval shape, but can have a shape close to a substantially circular shape. Also, the first main plate 201, the first frame 211, and the second frame 221 may have different shapes.

Ninth Embodiment

Figure 13:
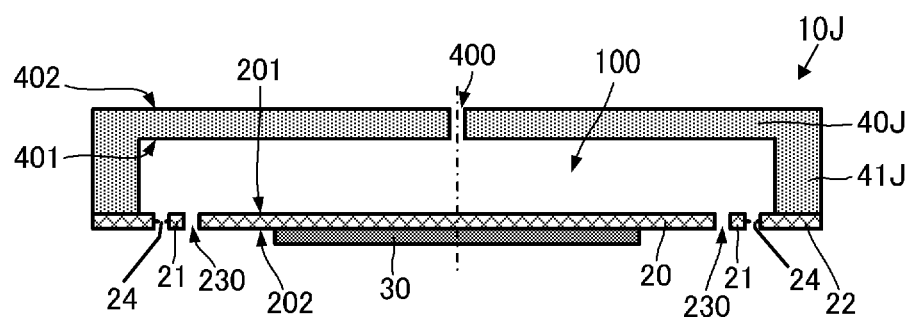
FIG. 13 is a sectional view illustrating the structure of a fluid control device according to a ninth embodiment.

A fluid control device according to a ninth embodiment of the present disclosure will now be described with reference to the drawings. FIG. 13 is a sectional view illustrating the structure of the fluid control device according to the ninth embodiment.

As illustrated in FIG. 13, a fluid control device 10J according to the ninth embodiment differs from the fluid control device 10 according to the first embodiment in that a second main plate 40J including a projecting portion 41J is provided. Other structures of the fluid control device 10J are similar to those of the fluid control device 10, and description of similar features will be omitted.

The fluid control device 10J includes the second main plate 40J. The second main plate 40J includes the projecting portion 41J, which is substantially annular, at the outer edge thereof. The projecting portion 41J is shaped to extend from the third principal surface 401 of the second main plate 40J in a direction away from the third principal surface 401. The projecting portion 41J is formed integrally with a flat plate portion of the second main plate 40J. The second main plate 40J is disposed such that a side thereof where the projecting portion 41J is provided (side of the third principal surface 401) faces the first main plate 20. The projecting portion 41J is in contact with the second frame 22. Thus, the pump chamber 100 is formed.

The fluid control device 10J having the above-described structure has effects similar to those of the fluid control device 10.

Figure 14:
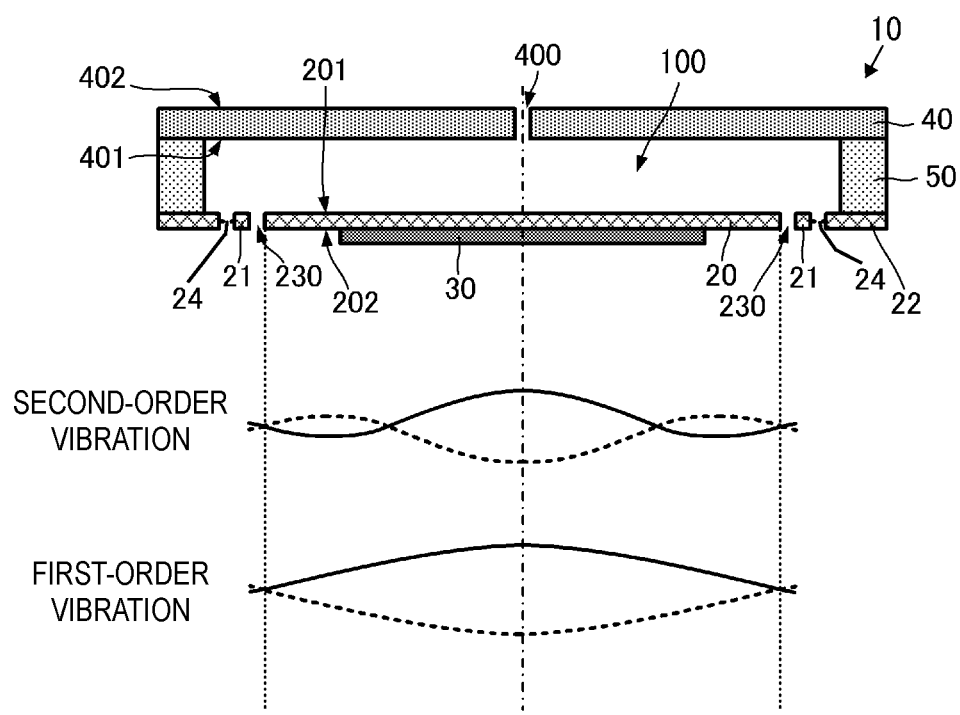
FIG. 14 illustrates the states of vibration of a vibrating portion of a fluid control device.

Although an example in which second-order vibration is generated is described above, the order of vibration is not limited to this. FIG. 14 illustrates states of vibration of a vibrating portion of a fluid control device. As illustrated in FIG. 14, the vibration of the vibrating portion may be either second-order vibration or first-order vibration. Although the vibration may also be third-order vibration, the area in which the amplitude is large is reduced in such a case. Therefore, the vibration can be first-order or second-order vibration. In such a case, the fluid control device has good flow rate characteristics.

In addition, in the above-described example, the shape (shape in plan view) of the apertures 230 is substantially circular. However, the apertures 230 may instead have, for example, a substantially polygonal, elliptical, or oval shape. The apertures 230 may instead be substantially band-shaped and extend in a circumferential direction of the first main plate.

The structures of each of the above-described embodiments may be combined as appropriate, and effects corresponding to the combinations can be obtained.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A fluid control device comprising:
a first main plate having a first principal surface and a second principal surface;
a second main plate having a third principal surface, a fourth principal surface, and a first aperture that connects the third principal surface and the fourth principal surface, the second main plate being disposed such that the third principal surface faces the first principal surface of the first main plate and including a projecting portion projecting from the third principal surface at an outer edge of the second main plate;
a driving body provided on the first main plate and configured to vibrate the first main plate;
a first frame disposed outside an outer peripheral end of the first main plate;
first connecting portions that connect the first main plate and the first frame;
second apertures, each of which is formed between adjacent ones of the first connecting portions and connects the first principal surface and the second principal surface;
a second frame disposed outside an outer peripheral end of the first frame;
a pump chamber between the projecting portion at the outer edge of the second main plate and the second frame, the pump chamber communicating with the first aperture and the second apertures;

a second connecting portion connecting the first frame and the second frame;

a third aperture extending from the second connecting portion to the second frame in a radial direction of the fluid control device; and a fourth aperture, wherein a central portion of the fourth aperture extends from the first frame to the second frame in the radial direction.

2. The fluid control device according to claim 1, wherein the first main plate is a substantially circular plate.

3. The fluid control device according to claim 1, wherein an outer peripheral shape of the first frame is substantially circular.

4. The fluid control device according to claim 1, wherein the second apertures are on a circumference surrounding the first main plate.

5. The fluid control device according to claim 1, wherein the second connecting portion has a modulus of elasticity lower than a modulus of elasticity of the first connecting portions and a modulus of elasticity of the first frame.

* * * * *